(12) United States Patent
Shakeshaft et al.

(10) Patent No.: US 7,421,037 B2
(45) Date of Patent: Sep. 2, 2008

(54) RECONFIGURABLE TRANSMITTER WITH DIRECT DIGITAL TO RF MODULATOR

(75) Inventors: Niall Eric Shakeshaft, Helsinki (FI);
Jussi Heikki Vepsäläinen, Helsinki (FI);
Petri Tapani Eloranta, Espoo (FI);
Pauli Mikael Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 573 days.

(21) Appl. No.: 11/118,883

(22) Filed: Apr. 29, 2005

(65) Prior Publication Data

US 2005/0191976 A1    Sep. 1, 2005

Related U.S. Application Data

(63) Continuation-in-part of application No. 10/717,986, filed on Nov. 20, 2003, now Pat. No. 6,937,848, and a continuation-in-part of application No. 10/988,202, filed on Nov. 12, 2004, now Pat. No. 6,980,779.

(51) Int. Cl.
*H04L 27/00* (2006.01)
(52) U.S. Cl. .............. 375/295; 375/298; 375/297; 375/300
(58) Field of Classification Search ........... 375/296, 375/302, 261, 269, 297, 376, 300, 295, 298
See application file for complete search history.

(56) References Cited

U.S. PATENT DOCUMENTS 5,905,760 A * 5/1999 Schnabl et al. ............. 375/296

6,078,628 A * 6/2000 Griffith et al. ............. 375/300
6,647,073 B2 * 11/2003 Tapio ....................... 375/297

(Continued)

FOREIGN PATENT DOCUMENTS

WO      WO 02/37667       5/2002

OTHER PUBLICATIONS

IEEE 0-7803-7761-3/03; Proceedings of the 2003 International Symposium, vol. 3, Sec. 2-4; A. Hadjichristos; "Transmit Architectures and Power Control Schemes for Low Cost Highly Integrated Transceivers for GSM/EDGE Applications"; pp. III-610-III-613; May 2003.

(Continued)

*Primary Examiner*—Chieh M. Fan
*Assistant Examiner*—Sudhanshu C. Pathak
(74) *Attorney, Agent, or Firm*—Ware, Fressola, Van Der Sluys & Adolphson, LLP

(57) ABSTRACT

A radio frequency (RF) transmitter uses two digital-to-RF conversion modules to convert digital baseband signals into RF signals. In cartesian mode, baseband signals are conveyed to the conversion modules for RF conversion. In polar mode, baseband signals are converted into amplitude and phase data parts. Phase data part is converted into I (inphase) and Q (quadrature) data parts to be converted into RF signals which are modulated in a power amplifier by amplitude data part through the power supply of the power amplifier. Each digital-to-RF module uses parallel unit cells to perform digital-to-analog (D/A) conversion and upconversion functions by an IF signal. Each unit cell, adapted to receive a control voltage indicative of a data signal value, is a mixer cell type converter having a differential data switch section connected in series to a differential LO (local oscillator)-switch pair. LO-switch is further connected in series to a current source.

14 Claims, 12 Drawing Sheets

U.S. PATENT DOCUMENTS

| | | | |
|---|---|---|---|
| 6,751,265 B1* | 6/2004 | Schell et al. | 375/269 |
| 6,834,084 B2* | 12/2004 | Hietala | 375/296 |
| 6,898,257 B2* | 5/2005 | Fischer et al. | 375/376 |
| 7,126,999 B2* | 10/2006 | Dent | 375/261 |
| 7,227,497 B2* | 10/2007 | Hietala et al. | 375/302 |
| 7,280,612 B2* | 10/2007 | Saed | 375/296 |
| 2003/0067994 A1 | 4/2003 | Chadwick | 375/295 |
| 2004/0166813 A1 | 8/2004 | Mann et al. | 455/69 |
| 2005/0190854 A1* | 9/2005 | Shakeshaft et al. | 375/295 |
| 2007/0014382 A1* | 1/2007 | Shakeshaft et al. | 375/297 |

OTHER PUBLICATIONS

34th European Microwave Conference, Amsterdam; Jau et al.; "Polar Modulation-Based RF Power Amplifiers with Enhanced Envelope Processing Technique"; pp. 1317-1320; Oct. 2004.

IEEE Journal of Solid-State Circuits, vol. 39, No. 12; IEEE 0018-9200/04; Sowlati et al.; "Quad-Band GSM/GPRS/EDGE Polar Loop Transmitter"; pp. 2179-2189; Dec. 2004.

IEEE Journal of Solid-State Circuits 0018-9200/02, vol. 37, No. 9; Gutierrez-Aitken et al.; "Ultrahigh-Speed Direct Digital Synthesizer Using InP DHBT Technology"; pp. 1115-1119; Sep. 2002.

IEEE 2001 Custom Integrated Circuits Conference 0/7803/6591-7/01; Splett et al.; "Solutions for highly integrated future generation software radio basestation transceivers"; pp. 511-518; 2001.

IEEE 0-7803-3625-9/96; Koli et al., "Current-Mode Up-Converting D/A-Interface for Mobile Communication Transmitter Applications"; pp. 20-24; 1996.

IEEE 0018-9200/03; Zhou et al.; "A 10-Bit Wide-Band CMOS Direct Digital RF Amplitude Modulator"; pp. 1182-1188; 2003.

* cited by examiner

RECONFIGURABLE TRANSMITTER WITH DIRECT DIGITAL TO RF MODULATOR

This is a Continuation-In-Part application of and claiming priority to U.S. patent applications Ser. No. 10/717,986, filed Nov. 20, 2003; now U.S. Pat. No. 6,937,848 and Ser. No. 10/988,202, filed Nov. 12, 2004, now U.S. Pat. No. 6,980,779 assigned to the assignee of the instant application.

CROSS REFERENCE TO RELATED APPLICATIONS

The present invention is related to patent application Ser. No. 10/832,110, assigned to the assignee of the present invention, filed even date herewith.

FIELD OF THE INVENTION

The present invention relates generally to a RF transmitter and, more particularly, to a re-configurable transmitter with a digital-to-RF converter.

BACKGROUND OF THE INVENTION

In radio communication applications the designs are continuously aiming for simpler and cheaper radio architectures to increase integration level of the mobile terminals. Conventionally, a direct upconversion transmitter has at least an I/Q modulator, an RF mixer, a filter and a power amplifier. The I/Q modulator is an efficient way to generate phase-modulated signals. It relies on two orthogonal signals, I (in-phase) and Q (quadrature), to produce a single complex waveform. In a direct upconversion transmitter the I/Q modulator transforms the frequency spectrum of each orthogonal input signal to the RF carrier frequency. As such, two digital-to-analog (D/A) converters are needed to transform a digital baseband into an analog baseband, as shown in FIG. 1a. In such a conventional direct upconversion transmitter, baseband digital data is resolved into in-phase and quadrature components. These data streams are then converted into analog, lowpass, baseband signals using separate digital-to-analog converters. The quantized, analog signals are then filtered by low-pass reconstruction filters in order to remove copies of the signals centered at harmonics of the baseband clock frequency. The filtered analog signals are used as inputs to the I/Q modulator. As shown in FIG. 1a, the I/Q modulator comprises two baseband-to-RF upconversion mixers with their output signals summed. The I/O modulator has two baseband inputs and two local oscillator inputs with 90° phase shift between the oscillator inputs ($\cos \omega_l t$ and $\sin \omega_l t$, with $\omega_l$ being the frequency of the local oscillator). The output of the I/Q modulator is an RF signal.

In order to make a complete transmitter, meeting the requirements of a real wireless standard, it may be necessary to include the following components:
- a power amplifier (PA) to increase the output power to the required level;
- a bandpass filter to suppress noise and/or spurious; and
- a power control module to achieve dynamic range capability, through one or more of the following means: 1) power amplifier gain adjustment; 2) variable-gain amplifier gain adjustment; and 3) I/Q modulator output power adjustment.

An example of such a direct upconversion transmitter is shown in FIG. 1b.

In recent years, other forms of transmitters have received attention from the RF R&D community: transmitters that use high efficiency, non-linear power amplifiers, including Class-C, D, E, F or saturated Class-B, in order to reduce transmitter power consumption. These non-linear power amplifiers, however, cannot pass amplitude modulation without spectral re-growth. Thus, the input RF signal can only have phase modulation. The amplitude modulation must be introduced separately in a PA power supply.

Due to the separation of amplitude and phase, these types of transmitter architecture are generically called Polar transmitters, as opposed to Cartesian transmitters which use I and Q baseband signals.

The polar transmitter architectures have the following general forms:

Envelope Elimination and Restoration (EER)

In this architecture, the RF signal is first produced with an I/Q modulator. The envelope is detected and fed forward to the PA power supply. The signal then goes through a limiter to keep a PM-only signal before being fed to the power amplifier. This architecture often includes an up-conversion as well, sometimes with an offset-loop approach.

Polar TX with Synthesizer Modulation

In this approach there is no envelope elimination and restoration, but rather the amplitude and phase signals are created in the digital baseband. The amplitude signal is fed to a DAC (digital to analog converter) and onto the non-linear power amplifier and power supply. The phase signal, which is differentiated to carry out frequency modulation, is used to modulate a phase-locked loop synthesizer. The synthesizer is often a fractional-N PLL with the FM data put into a sigma-delta modulator to obtain frequency modulation. In order to extend the bandwidth beyond the PLL loop bandwidth the following techniques can be used:
- Predistortion or pre-emphasis to compensate for loop filter dynamics;
- Addition of a second 'high pass' phase modulation path directly to the VCO control pin, in a two point modulation approach (see FIG. 2); and
- Use of phase feedback.

Fundamental problems associated with the direct upconversion transmitter using an I/Q modulator are:
- High-power consumption in the I/Q Modulator block;
- Non-ideal performance in the analog components within the I/Q modulator, such as non-linearity of the baseband amplifiers, carrier feed-through due to mismatch effects;
- Bandwidth limited by analog baseband circuits; and
- Large die area required for integrating all functions.

Current-steering D/A-converters may solve some the aforementioned problems associated with convention upconversion transmitter. A conventional current-steering D/A-converter comprises a plurality of parallel unit cells divided into two or more sub-blocks, as shown in FIG. 4. In the figure, the converter is presented in a typical segmented configuration, wherein the current in the LSB (least-significant bit) cells is generated with parallel binary weighted units whereas the MSB (most-significant bit) sub-block has a set of unary coded cells. The number of the unary coded cells is ($2^m - 1$), where m is the number of bits in the MSB sub-block. Thus, the current for the first bit in the MSB sub-block is generated in one unary coded cell, the current for the second bit in the MSB sub-block is generated in two unary coded cells, and the current for the m bit is generated in $2^{m-1}$ cells. The D/A converter has two current paths for conveying differential currents $I_{out}$ and $I_{xout}$ so that the analog signal output $V_{out}$ can be formed with two external load resistors (not shown).

Typically, each of the parallel unit cells comprises a differential switch pair connected in series to a cascode current source, as shown in FIG. 5. The differential switch pair has two current control paths Q1 and Q2, connected to the output terminals $V_o$ and $V_{xo}$ of the D/A converter. The currents in these paths are controlled by complementary signals $V_{LN+}$ and $V_{LN-}$, which are provided by a digital control logic and are indicative of the value of signal N. The cascode current source has two transistors Q3 and Q4 so as to allow the currents in the cell to be adjusted by DC bias4.

The D/A converters and I/Q modulators are complex and high performance analog elements. The requirement of these analog elements generally limits the flexibility of the RF transmitter.

Fully Digital Radio Transmitter

Ideally a digital radio transmitter would be independent of the radio standard and could be used in all of the modulation schemes and signal frequencies. One way to do this would be to directly convert the digital baseband signal to RF signal using a D/A converter that is capable of operating at least twice the maximum radio frequency of the used standard. One of the major problems associated with D/A converters for use in RF generation is the high sampling frequency. If an RF signal of 1.8 GHz is generated, the sampling rate in the digital baseband must be at least 3.6 GHz. Furthermore, in order to effectively filter the mirror image component around the frequency difference between the sampling frequency and the digital signal frequency, a much higher sampling rate is needed. A D/A converter with such a high sampling frequency is impractical to implement because of the high price and high power consumption. For that reason, D/A converters are typically used in the baseband or in the low IF range. These converters are used along with high performance analog mixers for RF generation. These I/Q mixers consume easily tens of milliamperes of DC currents. Moreover, even when the D/A converters are used in the baseband and in the IF range, the noise current spikes occur because of the high data rate of hundreds of megahertz. These noise spikes can limit the performance of the RF transmitter.

It is thus advantageous and desirable to provide a cost-effective method and device for carrying out digital-to-analog conversion associated with RF generation. At the same time, the power consumption is reduced.

Yuan (EP1338085) discloses a direct digital amplitude modulator wherein an upconverting type of converter cell is used. In Yuan, a number of sub-switched current source units are switched on or off according to the combinations of the digital input signal and the delayed or non-delayed clock signals to produce or to cancel quantized RF, IF or DC currents and/or voltages at the time precisely controlled by the delayed clock signals. As such, the performance of the circuit is low due to a slow settling of the current in the current source after switching the current source on.

It is advantageous and desirable to provide a method and device for direct digital amplitude modulation wherein the cutting off of the current flow is avoided.

SUMMARY OF THE INVENTION

The present invention uses two digital to RF-conversion modules to convert digital baseband signals into RF signals. The digital-to-RF conversion module combines the D/A conversion function and the upconversion function by a RF-carrier or IF-signal. The module comprises a plurality of parallel unit cells, each of which is a mixer cell type converter having a differential data switch section connected in series to a differential LO-switch pair. The differential LO-switch is further connected in series to a current source. Each unit cell is adapted to receive a control voltage indicative of a data signal value.

According to the present invention, I and Q baseband signals are converted by a Cartesian-to-Polar converter into an amplitude data part and a phase data part. The phase data part is reconverted by a Polar-to-Cartesian converter into an I phase data part and a Q phase data part to be used as the digital baseband signals to the digital-to-RF conversion modules. As such, the RF signals from the digital-to-RF conversion modules are phase modulated carrier with a constant envelope. After being amplified and bandpass filtered, the phase modulated carrier is amplitude modulated by the amplitude data part at a switched-mode power amplifier. In one embodiment of the present invention, the transmitter is a polar only RF transmitter. In another embodiment of the present invention, the transmitter is re-configurable so that it can operate in polar mode and in Cartesian mode.

Thus, the present invention provides an RF transmitter for transmitting RF signals based on a first digital baseband signal and a second digital baseband signal, the second baseband signal having a phase shift from the first baseband signal. The transmitter comprises:

a digital-to-RF converter having a converter input end for receiving a first digital signal and a second digital signal and a converter output end for providing first RF signals;

a power amplifier, responsive to the first RF signals, for providing the RF signals for transmission, the power amplifier having a voltage supply input;

a power supply operatively connected to the voltage supply input of the power amplifier for providing a supply voltage to the power amplifier; and a mode conversion means, responsive the first and second digital baseband signals, for providing signals in a polar form based on the first and second digital baseband signals, the signals in the polar form having an amplitude data part and a phase data part, the phase data part converted into a first phase angle data part and a second phase angle data part having a phase shift from the first phase angle data part, wherein the mode conversion means is operatively connected to the power supply such that a modulating signal based on the amplitude data part is provided to the power amplifier for modulating the supply voltage to the power amplifier, and the mode conversion means is also operatively connected to the digital-to-RF converter so as to convey the first and second phase angle data parts to the converter input end of the digital-to-RF converter for providing the first and second digital signals; wherein each of the first and second input digital signals has a plurality of data bits, and wherein the digital-to-RF converter comprises a first conversion component for receiving the first input digital signal, and a second conversion component for receiving the second input digital signal, each of the first and second conversion components converting the corresponding data bits for providing a differential output signal modulated by a carrier signal, the carrier signal provided between two carrier signal ends, wherein the differential output signal is formed with current loads and provided between two output ends, the different output signal indicative of the first RF signals, each of the conversion components comprising:

a plurality of conversion units connected in parallel, each unit adapted to receive a control voltage indicative of a data signal value, the control voltage provided between two control voltage ends, each unit comprising:

a first differential switch section having:

two input current paths, each operatively connected to a different one of the output ends; and two differential switch pairs connected to the control voltage ends for conveying in the two input current paths differential currents indicative of the data signal value;

a second differential switch section having two control current paths, each operatively connected in series to a different one of the two differential switch pairs, the control current paths operatively and separately connected to different ones of the carrier signal ends, for modulating the differential currents with the carrier signal; and a current source, operatively connected in series to the second differential switch section for further controlling currents in the control current paths.

According to the present invention, the RF transmitter is operable in a first mode and in a second mode. The transmitter further comprises:

a switching means operatively connected to the mode conversion means, such that when the transmitter is operated in the first mode, the switching means is adapted to disconnect the mode conversion means from the power supply and from the digital-to-RF converter, and to convey the first and second baseband signals to the converter input end of the digital-to-RF converter for providing the first and second digital signals; and when the transmitter is operated in the second mode, the switching means is adapted to convey the first and second phase angle data parts to the converter input end of the digital-to-RF converter for providing the first and second digital signals; and to convey the modulating signal to the power supply.

According to the present invention, the RF transmitter further comprises a power control module, operatively connected to the power supply, for adjusting the supply voltage to the voltage supply input when the transmitter is operated in the first mode.

According to the present invention, the RF transmitter further comprises a bandpass filter, responsive to the first RF signals, for filtering the first RF signals before the first RF signals are conveyed to the power amplifier, and a variable gain amplifier, responsive to the first RF signals, for adjusting signal level of the first RF signals before the first RF signals are filtered by the bandpass filter.

According to the present invention, the power control module is operatively connected to the digital-to-RF converter for adjusting output level of the first RF signals, and operatively connected to the variable gain amplifier for further adjusting the signal level of the first RF signals.

According to the present invention, the RF transmitter further comprises a digital-to-analog converter, responsive to the amplitude data part, for providing the modulating signal, and a frequency filter disposed between the digital-to-analog converter and the power supply for low-pass filtering the modulating signal.

According to the present invention, the amplitude data part is associated with a first path between the mode conversion module to the power amplifier through the digital-to-analog converter, and the phase data part is associated with a second path between the mode conversion module and the power amplifier through the digital-to-RF converter. The RF transmitter further comprises:

a path delay adjustment means, disposed between the mode conversion means and the power amplifier, for making the first path and the second path substantially equal.

According to the present invention, the current source comprises at least one current adjusting component having a control terminal, operatively connected to a bias voltage level, for adjusting the current passing through the current adjusting component; the second differential switch section comprises two current switching components disposed in different ones of the control current paths, each of the current switching components having a control terminal operatively connected to a different one of the carrier signal ends; and the first differential switch section comprises a first pair of differential switches and a second pair of differential switches, each pair having two current switches operatively connected to different ones of the control voltage ends.

The present invention will become apparent upon reading the description taken in conjunction with FIGS. 5-10.

DETAILED DESCRIPTION OF THE INVENTION

Figure 1A:
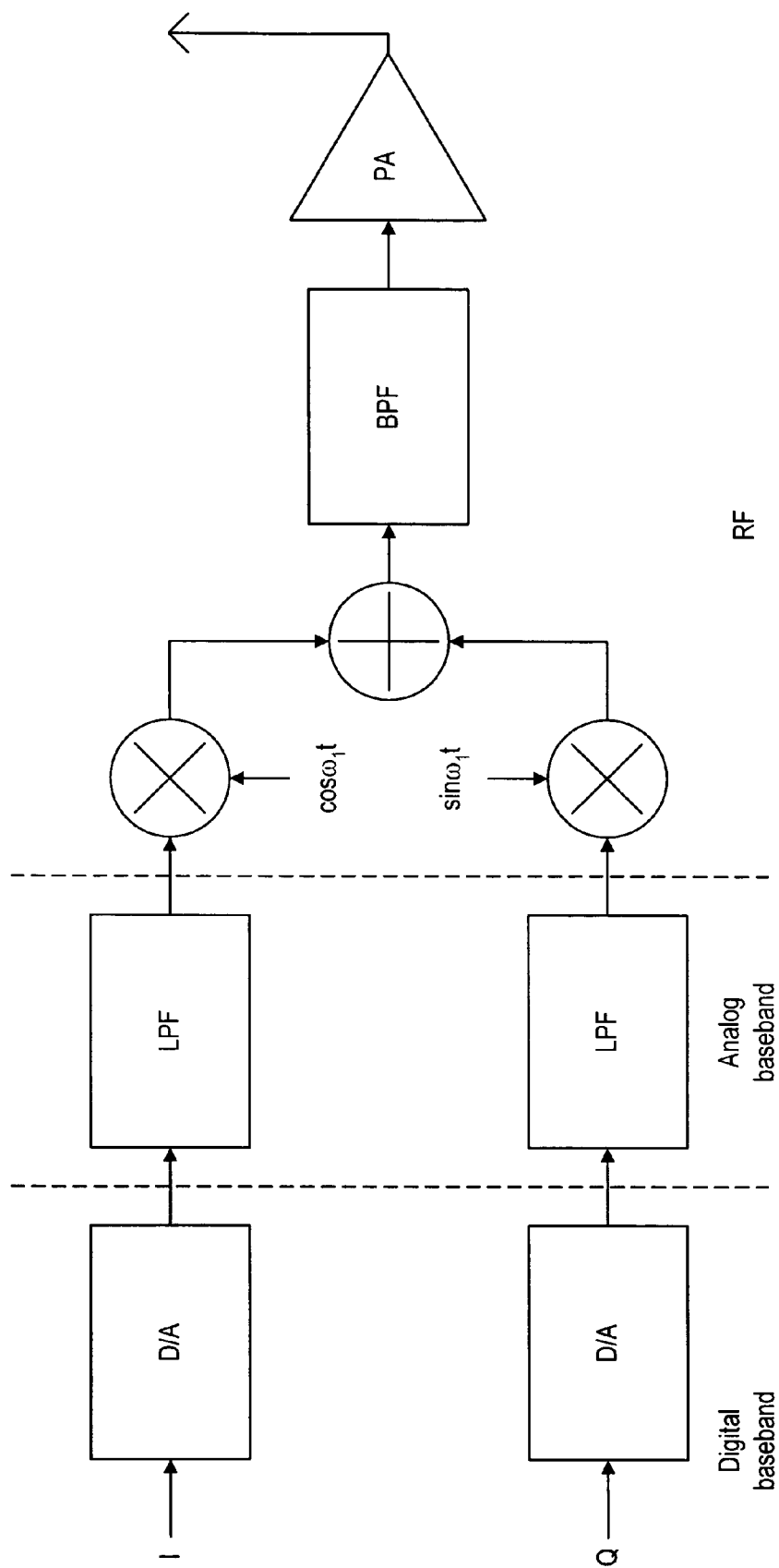
FIG. 1a is a block diagram showing a traditional direct upconversion transmitter.
Figure 1B:
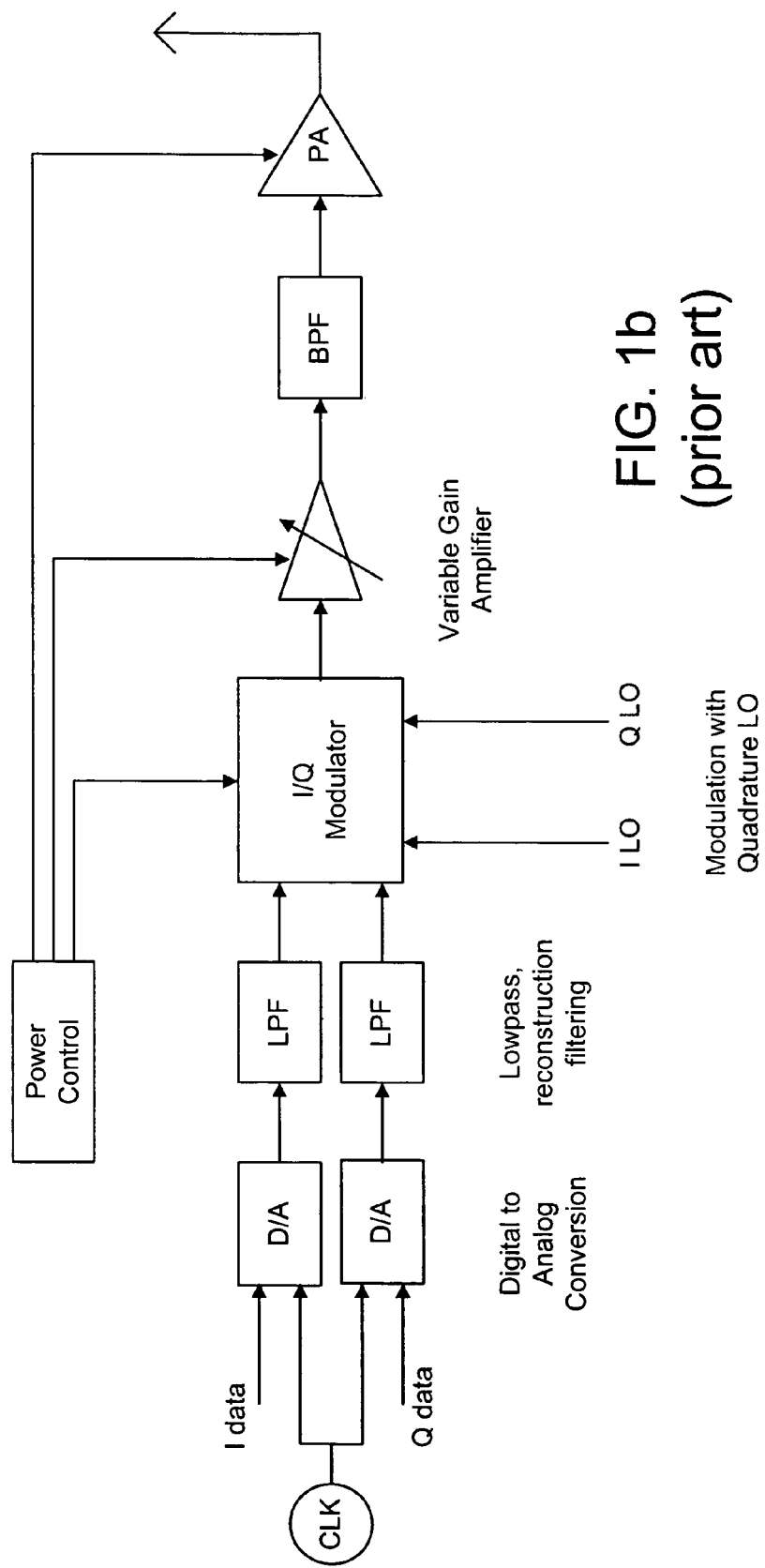
FIG. 1b is a block diagram showing a traditional direct upconversion transmitter with a variable gain amplifier and a power control module.
Figure 2:
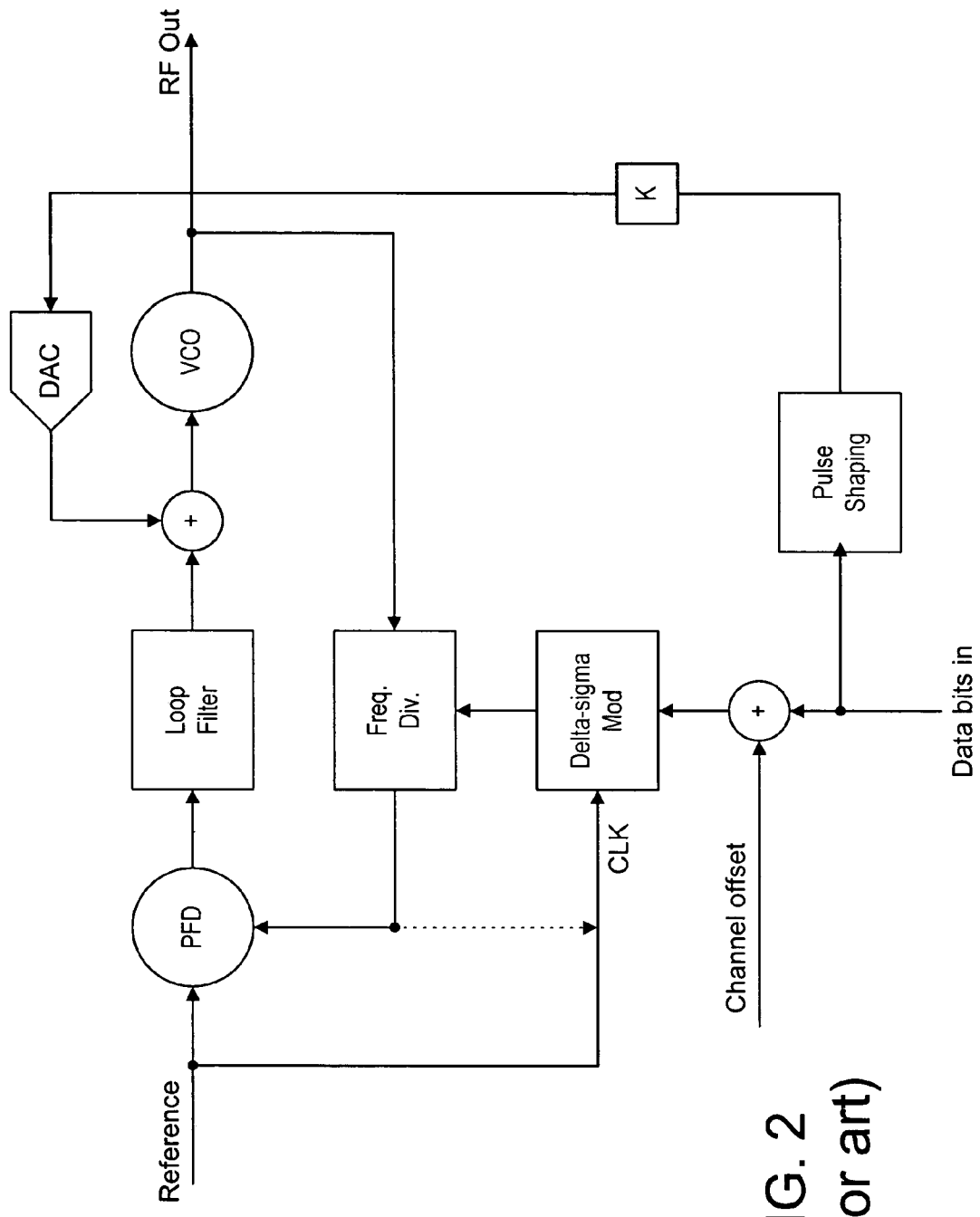
FIG. 2 is a block diagram showing a two-point synthesizer modulation module for use as a second high-pass phase modulation path in a prior art polar transmitter with synthesizer modulation.
Figure 3:
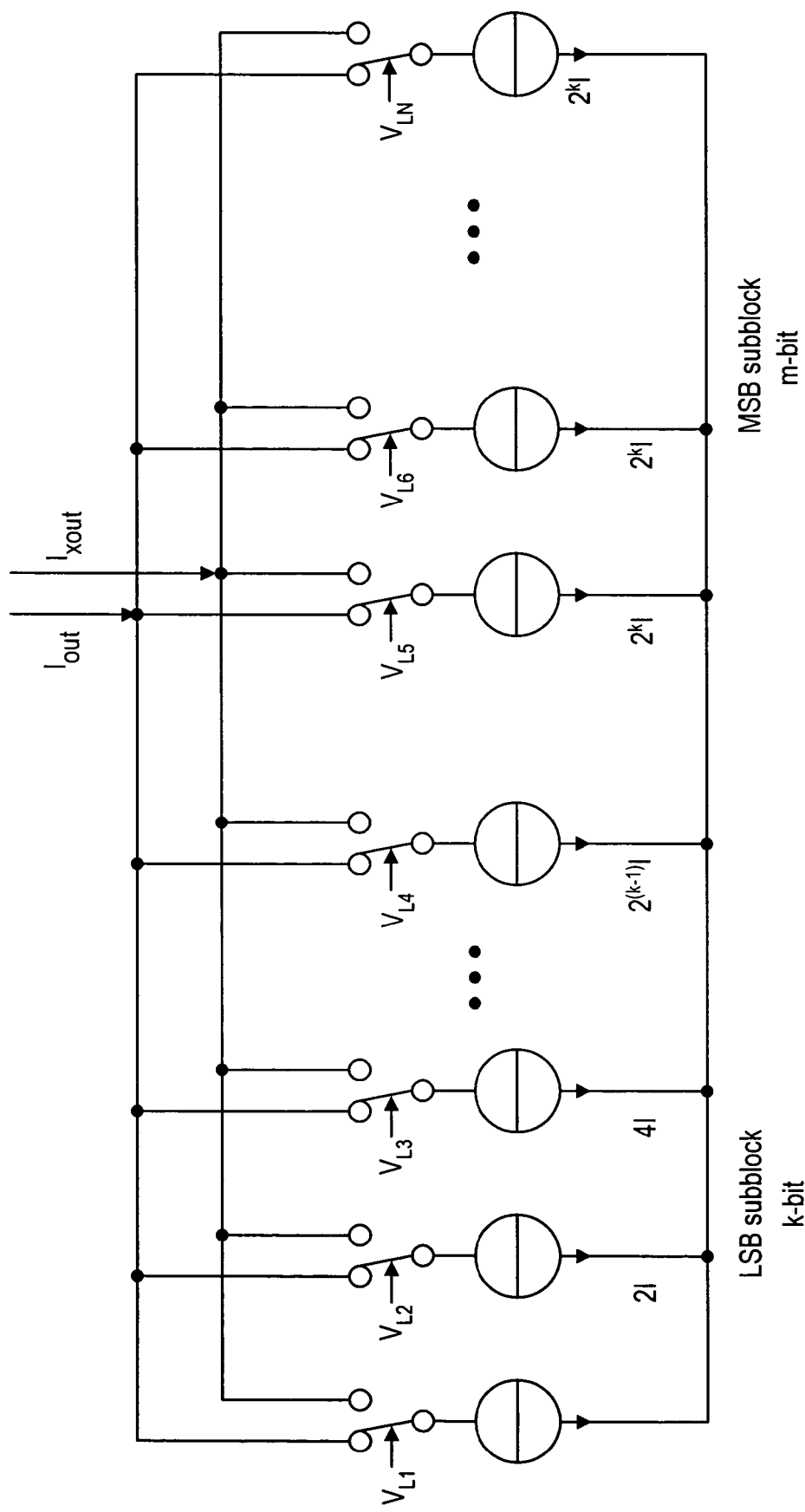
FIG. 3 is a schematic representation illustrating a prior art D/A converter.
Figure 5:
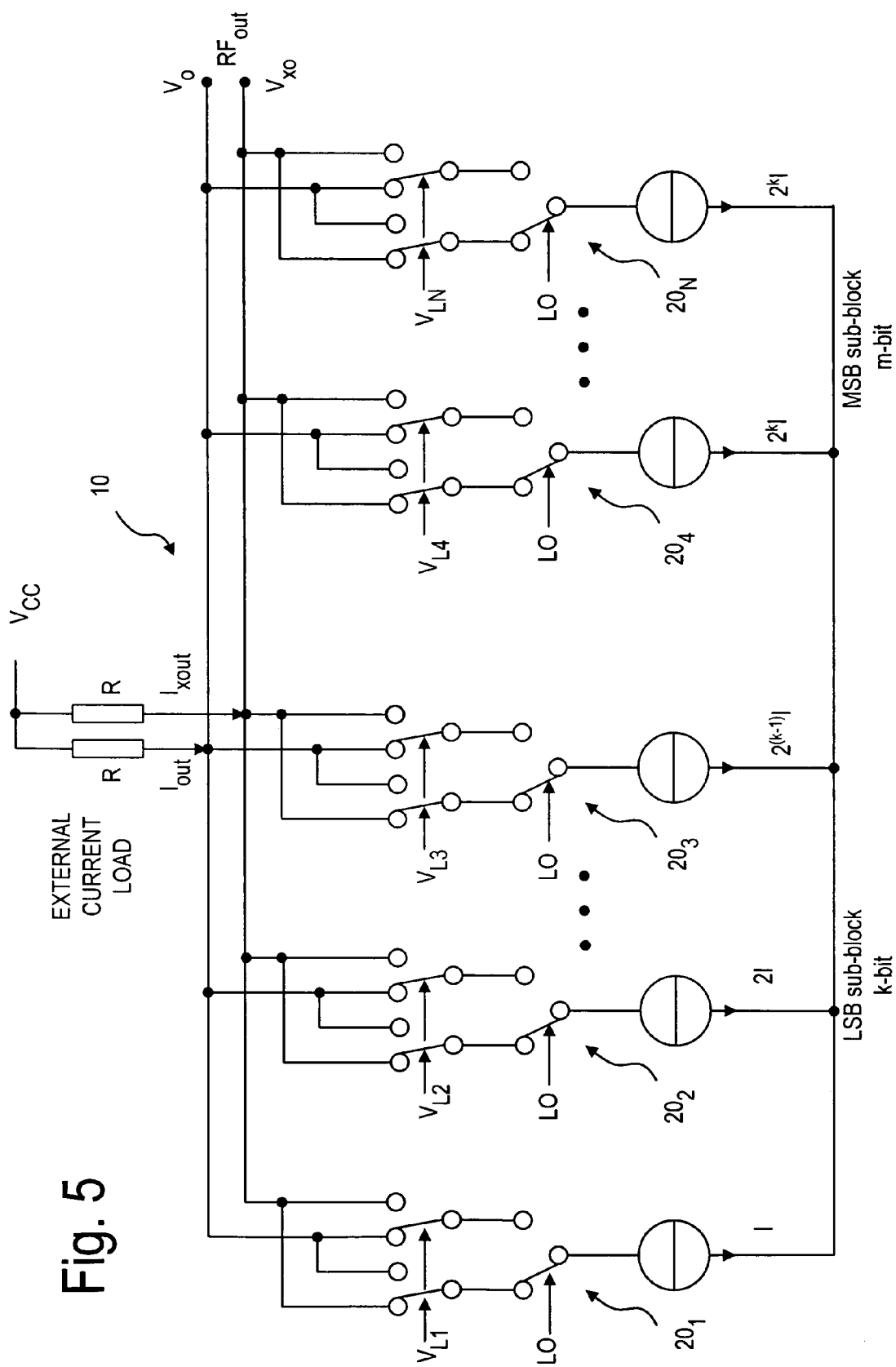
FIG. 5 is a schematic representation illustrating a Digital-to-RF-converter, according to the present invention.

The Digital-to-RF-converter, according to the present invention, combines the D/A conversion function and the upconversion function by a carrier (LO), which can be RF or IF. As shown in FIG. 5, the Digital-to-RF-converter 10 comprises a plurality of parallel unit cells $20_1, 20_2, \ldots, 20_N, \ldots$. The upconverter 10 has a segmented configuration, including an LSB sub-block and an MSB sub-block. The current in the LSB sub-block is generated with parallel binary weighted units, whereas the current in the MSB sub-block is generated in a set of unary coded cells. The unary coding can be also used in the LSB sub-block. As with the convention D/A converter shown in FIG. 1, the number of the unary coded cells in the MSB sub-block in the Digital-to-RF-converter 10 is also $2^m - 1$, where m is the number of bits in MSB sub-block. The Digital-to-RF-converter 10 has two differential current paths for conveying differential currents $I_{out}$ and $I_{xout}$, so that the modulated output signal, $RF_{out}$, can be formed with two external load resistors, R. The modulated output signal is provided at two terminals $V_o$ and $V_{xo}$. The upconversion is carried out by applying a carrier signal (LO) from a local oscillator to each of the parallel unit cells 20.

Figure 6:
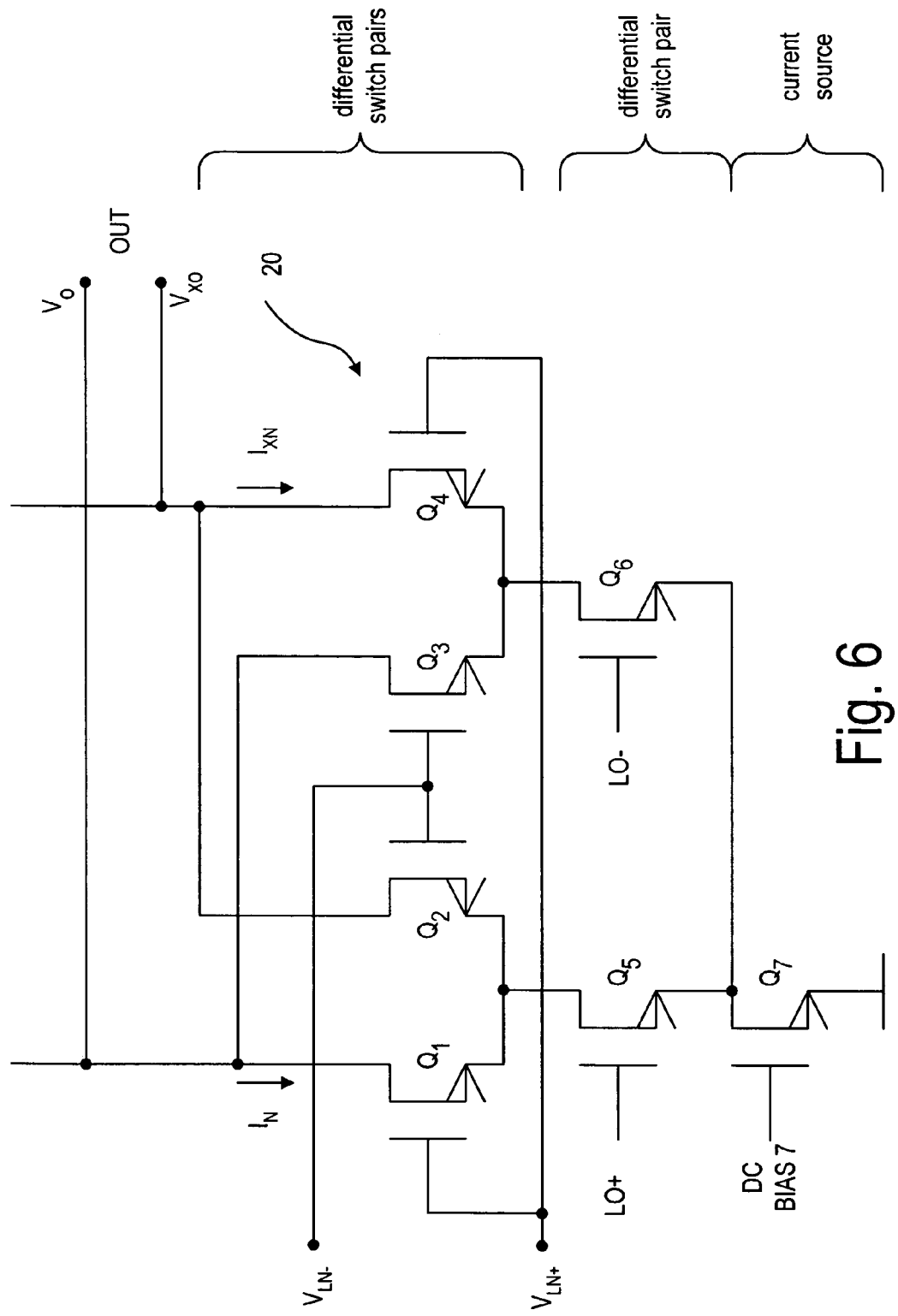
FIG. 6 is a circuitry showing a parallel unit cell in the Digital-to-RF-converter, according to the present invention.

Each of the parallel unit cells 20 is a Gilbert-cell type converter. It comprises a differential data switch section, connected in series with a differential LO-switch pair and a current source, as shown in FIG. 6. The differential data switch section has two differential switch pairs (Q1, Q2) and (Q3, Q4). Each differential data switch pair has two current control paths, $I_N$ and $I_{XN}$, connected to the output terminals $V_o$ and $V_{xo}$. The currents in these paths are controlled by complementary signals $V_{LN+}$ and $V_{LN-}$, which are provided by a digital control logic (not shown) and are indicative of the value of signal N. As shown in FIG. 6, the control voltage $V_{LN+}$ is used to control the currents in Q1 and Q4, and the control voltage $V_{LN-}$ is used to control the currents in Q2 and Q3. Accordingly, the current path Q1 is connected in parallel to the current path Q3. Likewise, the current path Q2 is connected in parallel to the current path Q4.

Figure 4:
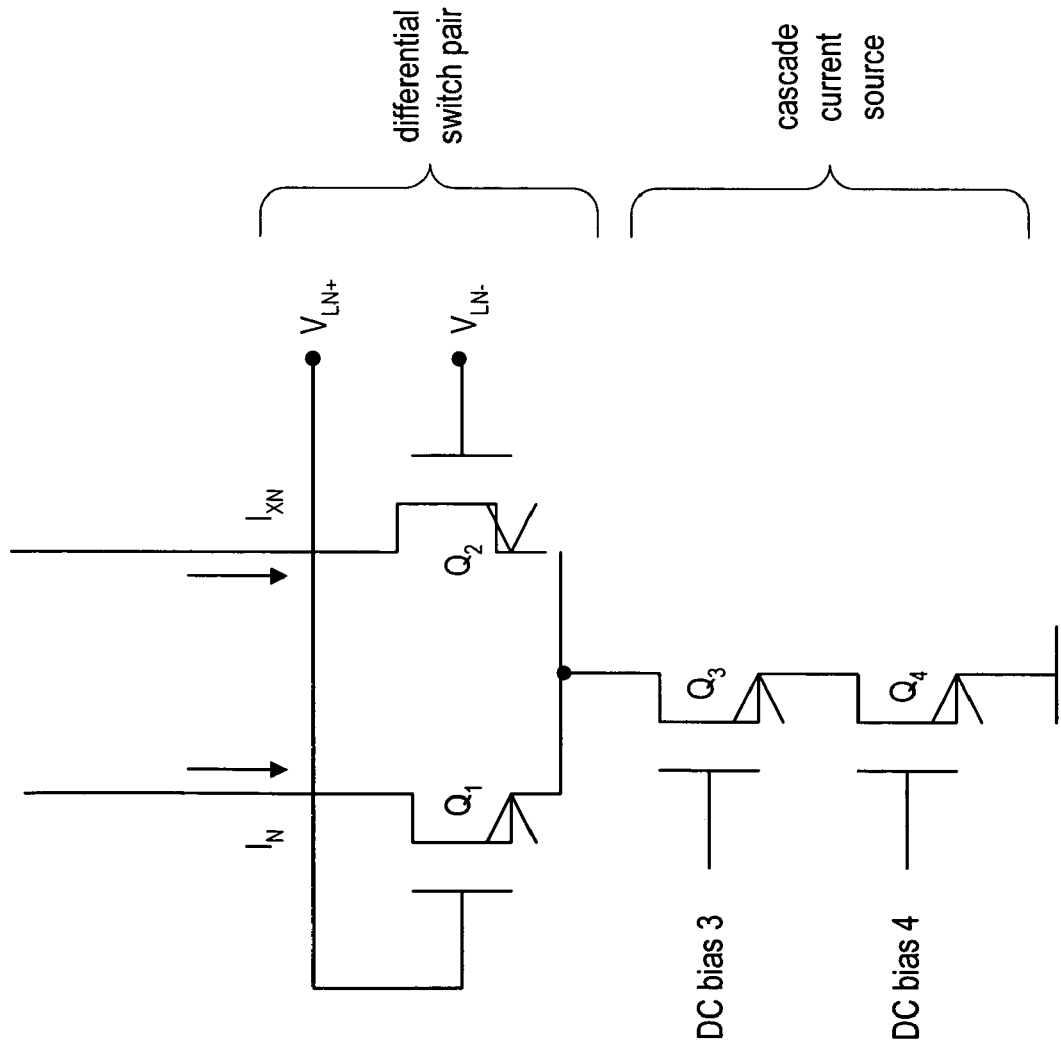
FIG. 4 is a circuitry showing a parallel unit cell in a prior art D/A converter.

Each of the differential data switch pairs is connected in series to a differential LO switches Q5 or Q6 so that the differential signals LO+ and LO− from the local oscillator (LO in FIG. 4) can be used to modulate the current in the differential data switch pairs. The differential LO switch formed with Q5 and Q6 is connected in series to the current source Q7, so as to allow the currents generated in the cell 20 to be adjusted by DC bias 7.

It should be noted that Q1 to Q7 depicted in FIG. 6 are MOS transistors, but any one of them can be replaced with other type of transistors.

Figure 7:
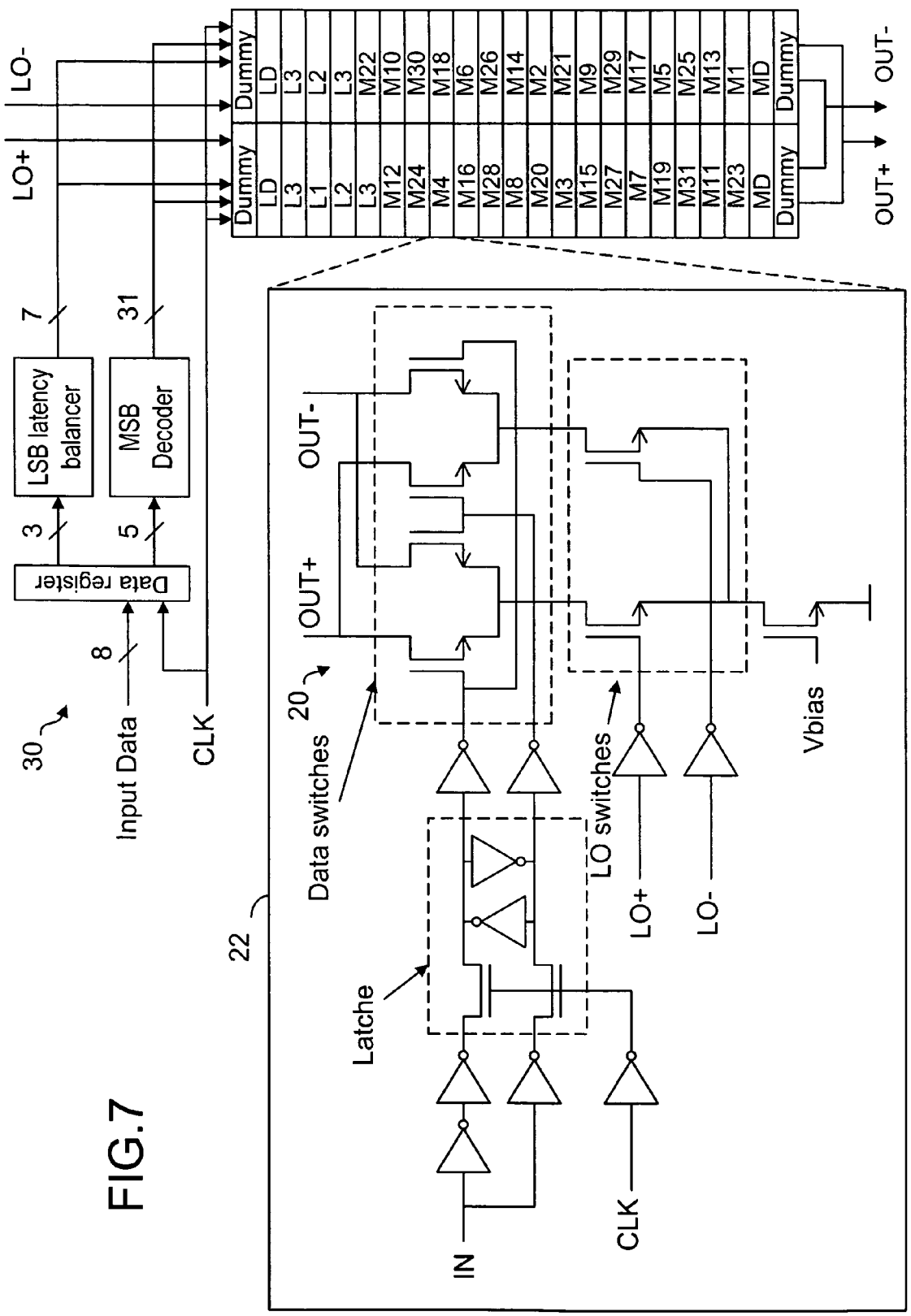
FIG. 7 is a circuitry showing a parallel unit cell in a converter architecture, according to the present invention.

In a converter architecture, according to the present invention, the switching elements in the cell 20 are also connected to an analog circuitry as shown in FIG. 7. As shown, the data signal is synchronized with a local latch and buffered with rail-to-rail inverters that provide overlapping control signals for the data switches. The local LO-buffers have also a full supply voltage swing for forcing the LO switches to operate in their linear region. As such, high linearity of the signals can be obtained with accurate timing and symmetry of the control waveforms for both the data and the LO switches.

In the direct digital-to-RF converter (DRFC) as shown in FIG. 7, the 8-bit data signal is converted using 5+3 segmentation, where 5 MSB's are converted with 31 unit conversion cells and 3 LSB's are converted using 7 unit conversion cells. The LSB current is $\frac{1}{8}^{th}$ of the MSB current. A thermometer decoder is used for converting the 5-bit binary signals for the MSB cells. The LSB cells are controlled without decoding. The LSB cells, a necessary number of cells are connected in parallel to form the binary weighting. The accurate LO distribution to all of the 38 unit cells is crucial in achieving the high dynamic performance. Tree-like distribution networks driven with large LO-buffers are used with well-balanced loads in all of the branches. The switching order to the MSB cells is optimized to compensate for the mismatch in the LO synchronization.

Figure 8:
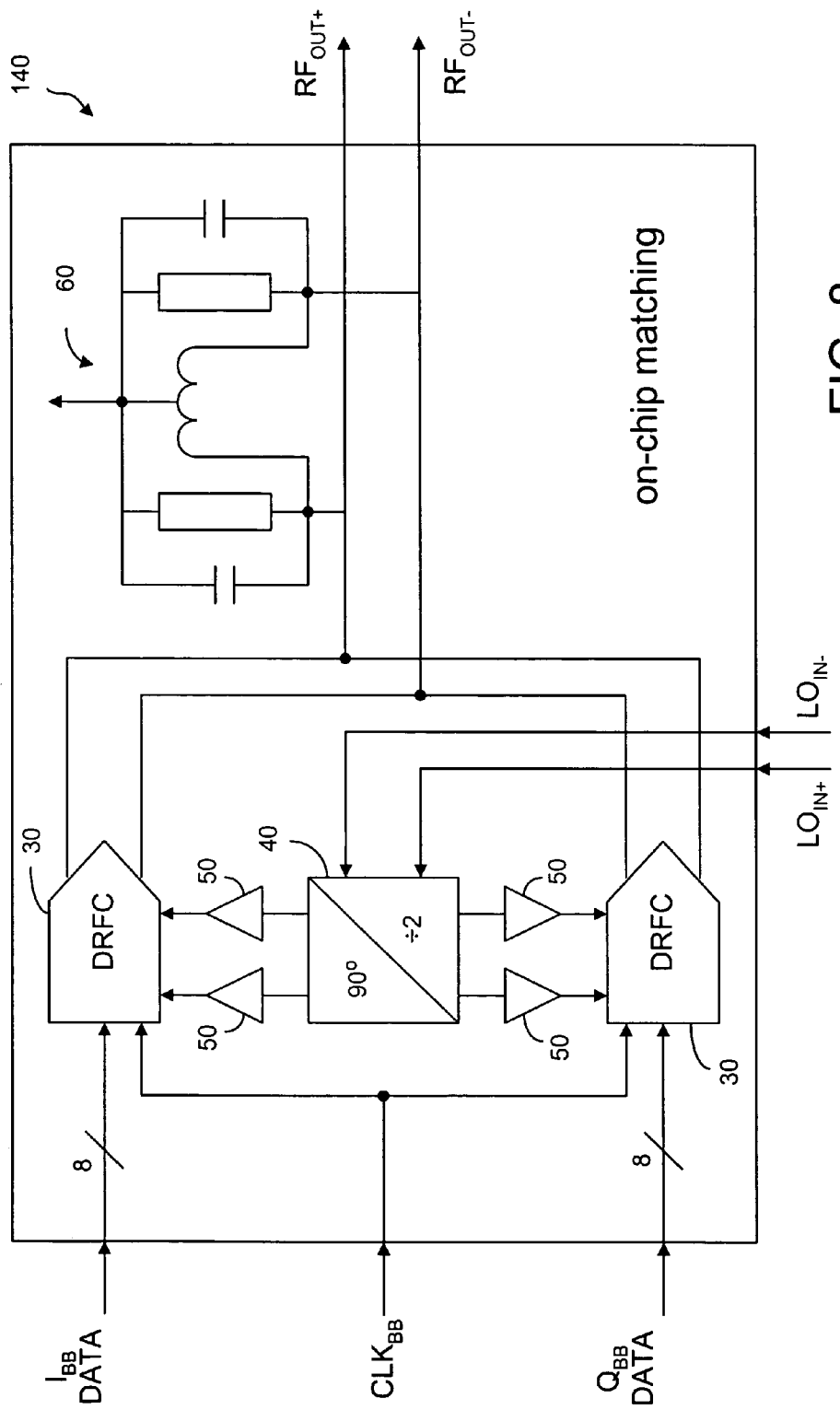
FIG. 8 shows a modulator block using two digital-to-RF converters, according to the present invention.

The present invention uses two direct digital-to-RF converters (DRFC's) to build a direct-digital RF modulator (DDRM). As shown in FIG. 8, the DDRM 140 comprises two direct digital-to-RF converters 30, a frequency divider 40, a plurality of LO-buffers 50 and an on-chip load 60. The functionality of the modulator 140 is similar to a traditional analog direct conversion modulator. However, because of the absence of the analog baseband, the undesirable effects such as phase and amplitude mismatch and DC-offset typically generated by the inaccurate analog components can be significantly reduced. In the DDRM 140, due to the switching characteristics of the signal generation, the amplitude mismatch is usually small, depending mainly on the bias current matching of the two DRFC's.

Figure 9A:
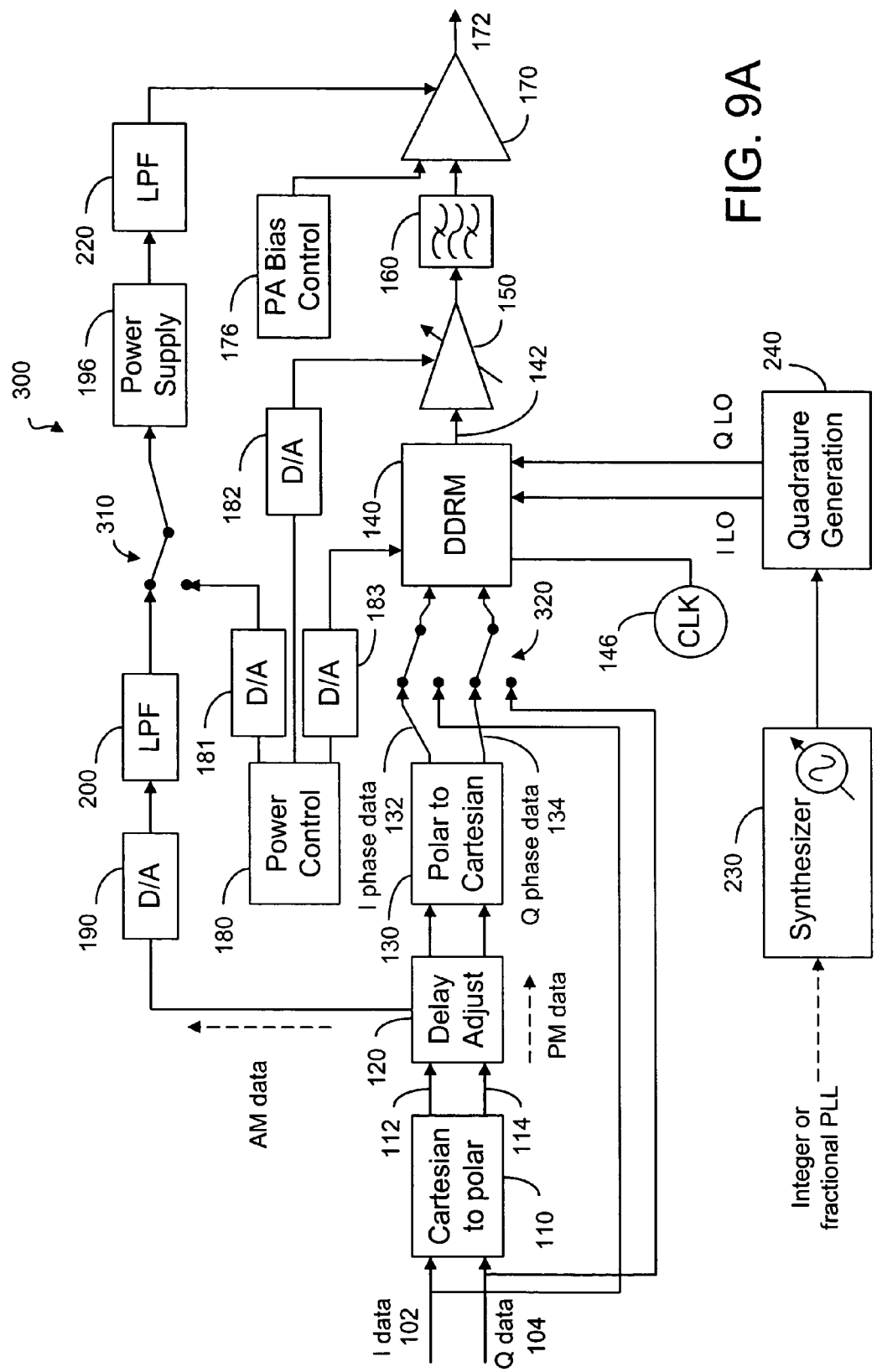
FIG. 9a is a block diagram showing a re-configurable transmitter with digital-to-RF-converter, according to the present invention, operated in polar-switched mode.
Figure 9B:
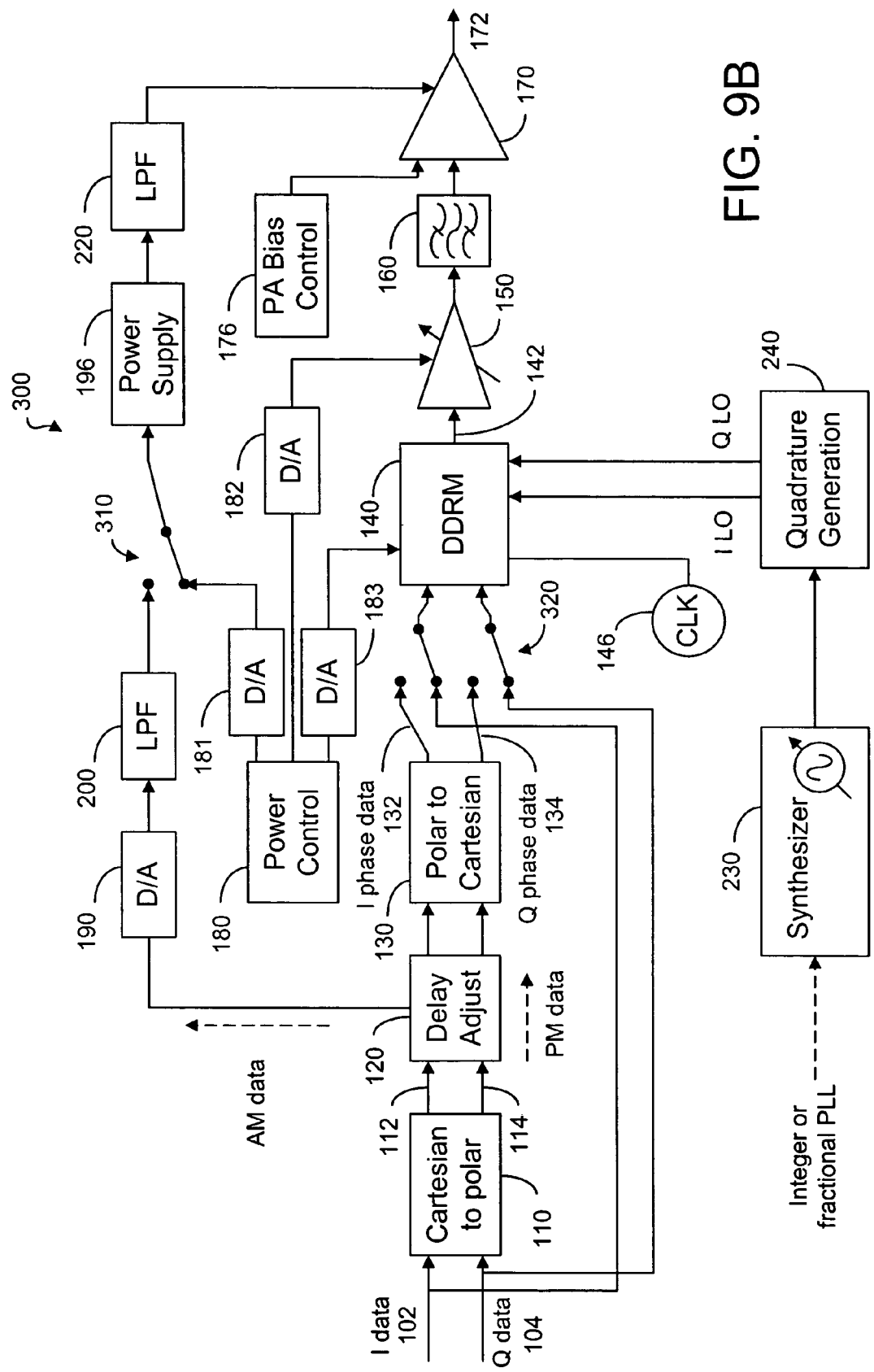
FIG. 9b is a block diagram showing the re-configurable polar transmitter with digital-to-RF converter, according to the present invention, operated in Cartesian linear mode.

The re-configurable transmitter, according to the present invention, is shown in FIGS. 9a and 9b. In particular, the re-configurable transmitter 300, according to the present invention, can operate as a polar transmitter in switched mode or as a Cartesian transmitter in linear mode. As a polar transmitter, the input RF signal can only have phase modulation through the digital-to-RF converter. The amplitude modulation is introduced separately in the power supply of the power amplifier. In the polar transmitter 300 as shown in FIG. 9a, I data 102 and Q data 104 are converted by a Cartesian-to-Polar converter 110 into an amplitude (AM) data part 112 and a phase (PM) data part 114. Because the AM data part and the PM data part go through different paths before they meet again at the power amplifier operated in switched-mode, their paths may be different. Thus, a delay adjustment block 120 is used to adjust the paths to make them substantially equal. The AM data part is fed to a DAC 190 and then fed forward so that the AM data part is imposed on the carrier through modulating the power supply (provided by a power supply 196) of a high-efficiency non-linear power amplifier 170. The PM data part is reconverted by a Polar-to-Cartesian converter 130 into Cartesian I data and Q data of "unit" or constant amplitude. I phase-data 132 and Q phase-data 134 are then converted by the DDRM 140 into a phase modulated carrier 142 with a constant envelope.

In order to make a complete transmitter, it may be necessary that the transmitter 100 further comprises a variable gain amplifier 150, and a bandpass filter 160 to suppress noise and spurious. In order to meet the requirement of a wireless standard, a power control module 180 is operatively connected to the DDRM 140, the variable gain amplifier 150 and the power amplifier 170 through digital-to-analog converters 181, 182, 183 so as to achieve desirable dynamic range capability and a desirable output level of the RF signals at output 172.

Through the switches 310 and 320, the transmitter 300 can also operate as a Cartesian transmitter in linear mode. The reconfigurable transmitter 300 further comprises a clock signal generator 146 to provide the clock signal $CLK_{BB}$ to the DDRM 140, a LO frequency synthesizer 230 and a quadrature generator 240 to provide $LO_{IN+}$ and $LO_{IN-}$ signals to the DDRM 140. The quadrature generator 240 can be a phase shifter or a quadrature divider. Moreover, a PA control 176 is used to provide PA bias voltages and currents to the power amplifier 170 based on whether the transmitter is operating in linear mode or in switched mode. The transmitter 300 may also comprise low-pass filters 200, 220 to suppress noise and other undesirable high-frequency components.

As shown in FIG. 9b, when the transmitter 300 operates in the Cartesian linear mode, I data 102 and Q data 104 are fed to the DDRM 140 so that digital data 102 and 104 are directly converted to RF in the DDRM 140. In this mode, the output signal from the DDFM 140 and the variable gain amplifier 150 contains both the AM and PM parts. Spurious and quantization noise can be filtered by the bandpass filter 160. As the same time, the power supply 196, under the control of the power control 180, provides a constant voltage supply to the power amplifier 170. When the transmitter 300 operates in the Cartesian linear mode, a number of component blocks can be turned off to save power. For example, the Cartesian-to-Polar converter 110, the delay adjustment block 120, the Polar-to-Cartesian converter 130, the DAC 190 and the low-pass filter 200 can be turned off. Furthermore, there is no need to make any sample rate conversions in order to cope with the bandwidth expansions that occur in a polar system. The dynamic range of the variable gain amplifier 150 can be obtained through the power control 180 and by adjusting the bias of the DRFC current sources (see FIG. 6).

Figure 10:
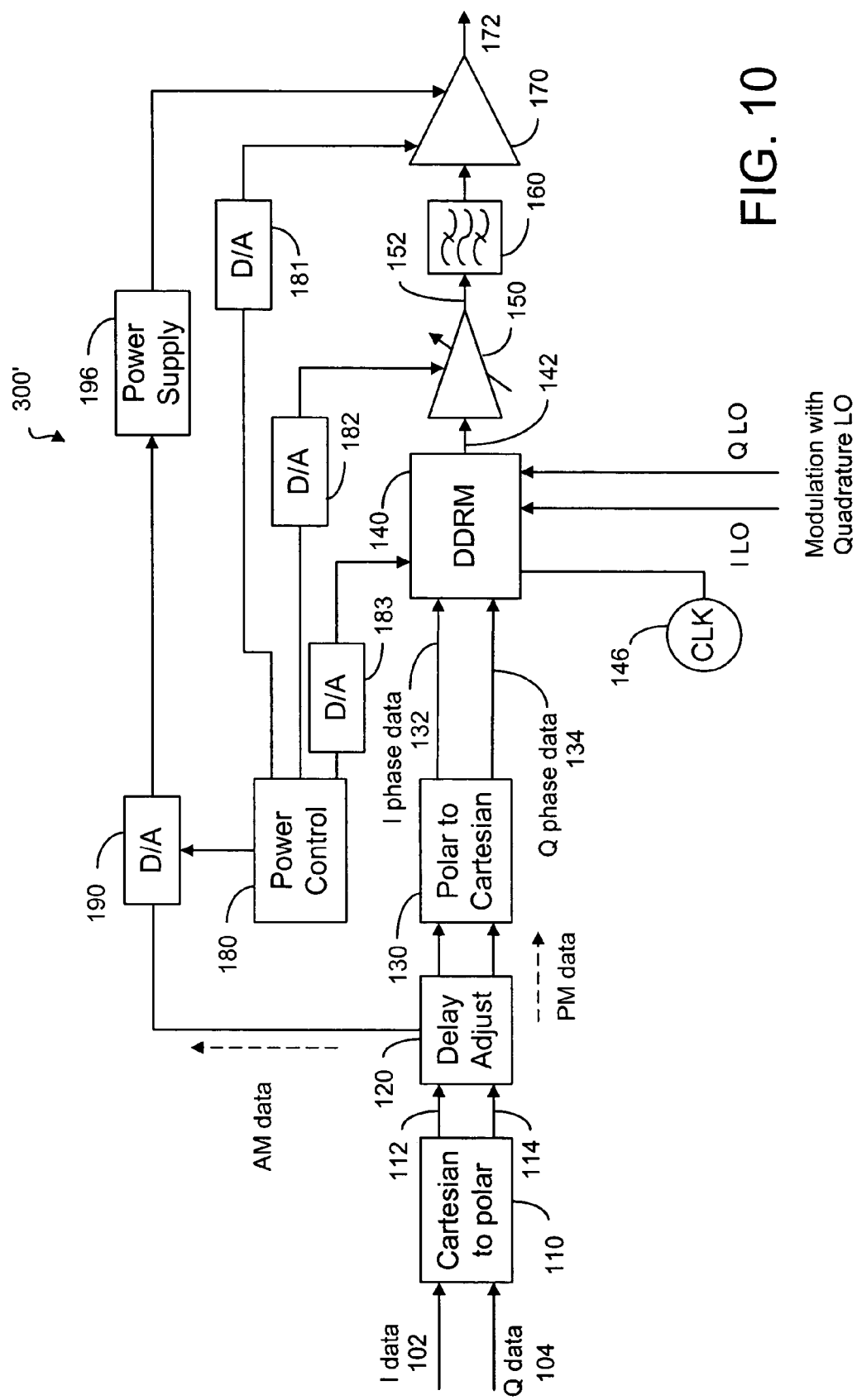
FIG. 10 is a block diagram showing a polar transmitter, according to another embodiment of the present invention.

The RF transmitter as shown in FIG. 9a can be simplified by removing the switches 320, 310 so it can be used as a polar only RF transmitter. Furthermore, one or both of the low-pass filters 200 and 220 may also be eliminated, as shown in FIG. 10.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A radio frequency (RF) transmitter for transmitting RF signals based on a first digital baseband signal and a second digital baseband signal, the second digital baseband signal having a phase shift from the first digital baseband signal, said transmitter comprising:
    a digital-to-RF converter having a converter input end for receiving a first digital baseband signal and a second digital baseband signal and a converter output end for providing first RF signals;
    a power amplifier, responsive to the first RF signals, for providing the RF signals for transmission, the power amplifier having a voltage supply input;
    a power supply operatively connected to the voltage supply input of the power amplifier for providing a supply voltage to the power amplifier; and
    a mode conversion module, responsive the first and second digital baseband signals, for providing signals in a polar form based on the first and second digital baseband signals, the signals in the polar form having an amplitude data part and a phase data part, the phase data part converted into a first phase angle data part and a second phase angle data part having a phase shift from the first phase angle data part, wherein the mode conversion module is operatively connected to the power supply such that a modulating signal based on the amplitude data part is provided to the power amplifier for modulating the supply voltage to the power amplifier, and the mode conversion module is also operatively connected to the digital-to-RF converter so as to convey the first and second phase angle data parts to the converter input end of the digital-to-RF converter for providing the first and second input signals; wherein
    each of the first and second input signals has a plurality of data bits, and wherein the digital-to-RF converter comprises a first conversion component for receiving the first input signal, and a second conversion component for receiving the second input signal, each of the first and second conversion components converting the corresponding data bits for providing a differential output signal modulated by a carrier signal, the carrier signal provided between two carrier signal ends, wherein the differential output signal is formed with current loads and provided between two output ends, the different output signal indicative of the first RF signals, each of the conversion components comprising:
    a plurality of conversion units connected in parallel, each unit adapted to receive a control voltage indicative of a data signal value, the control voltage provided between two control voltage ends, each unit comprising:
    a first differential switch section having:
        two input current paths, each operatively connected to a different one of the output ends; and
        two differential switch pairs connected to the control voltage ends for conveying in the two input current paths differential currents indicative of the data signal value;
    a second differential switch section having two control current paths, each operatively connected in series to a different one of the two differential switch pairs, the control current paths operatively and separately connected to different ones of the carrier signal ends, for modulating the differential currents with the carrier signal; and
    a current source, operatively connected in series to the second differential switch section for further controlling currents in the control current paths.

2. The radio frequency transmitter of claim 1, operable in a first mode and in a second mode, said transmitter further comprising:
    a switching unit operatively connected to the mode conversion module, such that
    when the transmitter is operated in the first mode, the switching unit is adapted
        to disconnect the mode conversion module from the power supply and from the digital-to-RF converter, and
        to convey the first and second digital baseband signals to the converter input end of the digital-to-RF converter for providing the first and second input signals; and
    when the transmitter is operated in the second mode, the switching unit is adapted
        to convey the first and second phase angle data parts to the converter input end of the digital-to-RF converter for providing the first and second input signals; and
        to convey the modulating signal to the power supply.

3. The radio frequency transmitter of claim 2, further comprising a power control module, operatively connected to the power supply, for adjusting the supply voltage to the voltage supply input when the transmitter is operated in the first mode.

4. The radio frequency of claim 1, further comprising:
    a bandpass filter, responsive to the first RF signals, for filtering the first RF signals before the first RF signals are conveyed to the power amplifier.

5. The radio frequency of claim 4, further comprising:
    a variable gain amplifier, responsive to the first RF signals, for adjusting signal level of the first RF signals before the first RF signals are filtered by the bandpass filter.

6. The radio frequency of claim 5, further comprising a power control module, operatively connected to the variable gain amplifier for further adjusting the signal level of the first RF signals.

7. The radio frequency of claim 1, further comprising:
    a variable gain amplifier, responsive to the first RF signals, for adjusting signal level of the first RF signals before the first RF signals are conveyed to the power amplifier.

8. The radio frequency of claim 1, further comprising a power control module, operatively connected to the digital-to-RF converter for adjusting output level of the first RF signals.

9. The radio frequency of claim 1, further comprising:
    a digital-to-analog converter, responsive to the amplitude data part, for providing the modulating signal.

10. The radio frequency of claim 9, further comprising:
    a frequency filter disposed between the digital-to-analog converter and the power supply for low-pass filtering the modulating signal.

11. The RF radio frequency of claim 9, wherein the amplitude data part is associated with a first path between the mode conversion module to the power amplifier through the digital-to-analog converter, and the phase data part is associated with a second path between the mode conversion module and the power amplifier through the digital-to-RF converter, said RF transmitter further comprising:

a path delay adjustment module, disposed between the mode conversion module and the power amplifier, for making the first path and the second path substantially equal.

12. The radio frequency of claim 1, wherein the current source comprises at least one current adjusting component having a control terminal, operatively connected to a bias voltage level, for adjusting the current passing through the current adjusting component.

13. The radio frequency of claim 1, wherein the second differential switch section comprises two current switching components disposed in different ones of the control current paths, each of the current switching components having a control terminal operatively connected to a different one of the carrier signal ends.

14. The radio frequency of claim 1, wherein the first differential switch section comprises a first pair of differential switches and a second pair of differential switches, each pair having two current switches operatively connected to different ones of the control voltage ends.

* * * * *

UNITED STATES PATENT AND TRADEMARK OFFICE
CERTIFICATE OF CORRECTION

PATENT NO. : 7,421,037 B2 Page 1 of 1
APPLICATION NO. : 11/118883
DATED : September 2, 2008
INVENTOR(S) : Niall Eric Shakeshaft et al.

It is certified that error appears in the above-identified patent and that said Letters Patent is hereby corrected as shown below:

In column 11, line 66, claim 11, line 1, "RF" should be deleted.

Signed and Sealed this

Twenty-first Day of October, 2008

JON W. DUDAS
*Director of the United States Patent and Trademark Office*